United States Patent [19]
Sakamoto

[11] Patent Number: 5,723,997
[45] Date of Patent: Mar. 3, 1998

[54] INTERFACE CIRCUIT OF AN ELECTRONIC FLASH UNIT

[75] Inventor: Hiroshi Sakamoto, Kanagawa-ken, Japan

[73] Assignee: Nikon Corporation, Tokyo, Japan

[21] Appl. No.: 572,690

[22] Filed: Dec. 14, 1995

[30] Foreign Application Priority Data

Dec. 15, 1994 [JP] Japan .................................. 6-311565

[51] Int. Cl.$^6$ .................................................. H03K 17/72
[52] U.S. Cl. .................................... 327/438; 327/444
[58] Field of Search ............................. 327/101, 438, 327/440, 441, 442, 444, 445, 446, 447, 453, 455, 461, 469

[56] References Cited

U.S. PATENT DOCUMENTS

| | | | |
|---|---|---|---|
| 3,610,961 | 10/1971 | Hewlett | 327/453 |
| 3,873,854 | 3/1975 | Lamb | 327/453 |
| 4,031,458 | 6/1977 | Ichikawa | 327/453 |
| 4,325,099 | 4/1982 | Morehouse et al. | 327/438 |
| 5,111,372 | 5/1992 | Kameyama et al. | 363/20 |
| 5,498,995 | 3/1996 | Szepesi et al. | 327/101 |

FOREIGN PATENT DOCUMENTS 1-172034  7/1989  Japan .

OTHER PUBLICATIONS

Malcolm "Fundamentals of Electronics", Breton Publishers, Boston 1987 pp. 276–277.

*Primary Examiner*—Timothy P. Callahan
*Assistant Examiner*—Jeffrey Zweizig
*Attorney, Agent, or Firm*—Oliff & Berridge, P.L.C.

[57] ABSTRACT

A synchronized flash emission of a strobe for high speed successive photo shooting. A transistor and a first resistor are connected in parallel to a resistor second of a strobe interface circuit. A control circuit switches the transistor ON for a duty cycle of 1/10 to increase the current flowing through a Triac to be greater than a holding current. The increased current raises the voltage of a synchronized signal to HIGH when the Triac is switched OFF. The strobe detects a HIGH to LOW transition of the synchronized signal even for successive photo shootings at high speed so that synchronized successive flashes can be provided.

19 Claims, 10 Drawing Sheets

0

INTERFACE CIRCUIT OF AN ELECTRONIC FLASH UNIT

BACKGROUND OF THE INVENTION

1. Field of the Invention

The invention relates to an interface circuit for an electronic flash unit.

2. Description of Related Art

In a camera, an electronic flash (strobe) flashes in response to a synchronized signal output by a switch of a shutter mechanism. Conventionally, a mechanical switch having a metallic contact mechanism is used to generate the synchronized signal. Because the mechanical switch fails to transmit the synchronized signal properly and has a short lifetime due to chattering and mechanical ware, respectively, it is common for the mechanical switch to be replaced by a semiconductor device.

Semiconductor devices such as Thyristors and Triacs are currently being used to generate the synchronized signal. However, the synchronized signal generated by these semiconductor devices limits the performance of many strobes.

In particular, semiconductor devices such as Thyristors and Triacs are self-held type semiconductor elements. Triacs, for example, are three terminal devices having a control terminal and two current conducting terminals. When the control terminal is HIGH, the Triac is switched ON and the two current conducting terminals are connected to each other and the voltage across the two current conducting terminals is LOW. When the control terminal is LOW, the Triac is switched OFF, the two current conducting terminals are disconnected from each other and the voltage between the two current conducting terminals is determined by other circuit components connected to the Triac.

When the Triac is ON and the current flowing between the current conducting terminals exceeds a holding current, the Triac will remain ON even when the control terminal becomes LOW. Thus, the Triac is switched OFF only when the control terminal is LOW and the current flowing between the current conducting terminals is below the holding current.

When the Triac is used in a camera to generate the synchronized signal, one of the current conducting terminals is connected to ground while the other current conducting terminal is connected to the strobe. The voltage level of the current conducting terminal connected to the strobe is the synchronized signal. When the synchronized signal changes from HIGH to LOW, the strobe flashes. After the strobe flashes, the Triac is turned OFF and the synchronized signal returns to HIGH. The strobe flashes again when the synchronized signal again changes from HIGH to LOW.

Because the strobe flashes only when the synchronized signal changes from HIGH to LOW, the strobe will not flash again until the synchronized signal returns from LOW to HIGH after a first flash so that the synchronized signal can change from HIGH to LOW again for a second flash. Accordingly, if the control terminal of the Triac switches the Triac ON again after the Triac was just switched OFF and the synchronized signal has not become HIGH, the strobe will not flash a second time because the synchronized signal did not change from HIGH to LOW.

in regard to the above problem, the applicant disclosed an "Interface Circuit Of An Electronic Flash Unit" in Jp 1-172034 (1989). The interface circuit allows an electric current, which is greater than the holding current of the Triac, to flow. FIG. 9 shows a circuit diagram including a Triac 1, a synchronized signal control circuit 2, the interface circuit 3, a receiving signal line 3-4, a synchronized signal terminal 4 and a signal line 5 connecting the Triac 1 to resistor R2 through the synchronized signal terminal 4. The Triac 1 and the synchronized signal control circuit 2 are disposed on the camera, while the interface circuit 3 is disposed on the strobe. The interface circuit 3 includes resistors R1 to R6, condensers C1 and C2, PNP transistors Tr 1 and Tr 2, an NPN transistor Tr 3, a control circuit 3-1 and a light emitting trigger circuit 3-2. The circuit in FIG. 9 prevents a current more than the holding current to flow to the Triac 1 through the signal line 5.

When the Triac 1 is turned ON, current flows from resistor R2 to the Triac 1 through the signal line 5. Because the other current conducting terminal of the Triac 1 is connected to ground, the voltage at the synchronized signal terminal 4 is LOW. When the Triac 1 is turned OFF, current is prevented from flowing through the Triac because the interface circuit 3 prevents a current more than the holding current to flow to the Triac 1. However, because of capacitance of the signal line 5, the voltage of the synchronized signal 4 remains at a LOW level until the current flowing through R2 of the interface circuit 3 charges the capacitance of the signal line 5 to raise the voltage of the synchronized signal 4 to HIGH.

This condition is shown in FIG. 10. (a) is a Triac control signal which controls the gate of the Triac 1; (b) is the synchronized signal; and (c) is a receiving signal of the strobe on the receiving signal line 3-4. At time t1, the Triac control signal (a) changes to HIGH and is synchronized with the switching ON of the Triac 1. The synchronized signal (b) falls to the LOW level without delay. The receiving signal (c) of the strobe also falls to the LOW level without delay. In a general photography mode, the strobe emits light at this point.

At time t2, the Triac control signal (a) changes to LOW. Because a current less than the holding current is flowing in the Triac 1, the Triac 1 instantly switches OFF. However, because of the capacitance of the signal line 5, the synchronized signal rises slowly being charged by the current from the strobe through resistor R2.

The strobe determines that the synchronized signal is HIGH when the voltage of the synchronized signal exceeds a threshold level th1. If the synchronized signal is below the threshold level th1, the strobe determines that the synchronized signal is LOW. Accordingly, after the Triac control signal (b) changes to LOW, the synchronized signal is determined to be LOW by the strobe until the synchronized signal exceeds the threshold level th1 at time t3. The receiving signal of the strobe follows the synchronized signal and remains LOW until the synchronized signal is HIGH at t3. Thus, there is a time delay Ta between when the Triac control signal (a) becomes LOW at t2 and when the strobe receiving signal becomes HIGH at t3.

Because of the time delay Ta, when the camera takes 2 frames of successive photo shooting at high speeds, the strobe only flashes once. This occurs because the Triac control signal (a) returns to HIGH before the synchronized signal becomes HIGH. The strobe does not detect the synchronized signal changing from HIGH to LOW. As shown in FIG. 11, the Triac control signal (a) returns to HIGH at t3 before the synchronized signal reaches HIGH. Thus, the receiving signal (c) remains LOW until t5 when the synchronized signal exceeds the threshold th1 and becomes HIGH.

Where this type of problem occurs in general electric circuits, the problem is resolved by increasing the electric current value through the addition of a pull-up resistor. However, because the current on the signal line 5 cannot be increased to be greater than the holding current of the Triac 1, a new solution is required.

SUMMARY OF THE INVENTION

An objective of the invention is to provide an interface circuit of an electronic flash unit which has the ability to emit a synchronized flash at high speed successive photo shootings, and to virtually eliminate the restrictions of the holding current. The invention provides a pull-up means to increase the current of the synchronized signal and a control means which selectively drives this pull-up means.

Another object of the invention is to drive the pull-up means with an average duty cycle of less than half using the control means.

Another object of the invention is to drive the pull-up means with an average duty cycle of less than half after the synchronized signal becomes LOW.

The invention shortens the time for the synchronized signal to return to HIGH after switching the Triac OFF by increasing the current driving the synchronized signal. The current driving the synchronized signal is periodically increased or is periodically increased only when the synchronized signal becomes LOW.

The invention provides an interface circuit for an electronic flash unit that responds to a synchronized signal of a synchronized signal line. The synchronized signal is generated by a self-held semiconductor device that is connected to the synchronized signal line. The self-held semiconductor device is in one of an ON state and an OFF state. When in the ON state, the self-held semiconductor device changes to the OFF state only if a current flowing through the semiconductor device is below a threshold current. The interface circuit includes a n electronic flash control circuit coupled to the synchronized signal line. The electronic flash control circuit flashes the electronic flash when a voltage level of the synchronized signal transitions from one of HIGH to LOW and LOW to HIGH. A pull-up circuit is coupled to the synchronized signal line. The pull-up circuit receives a control signal that switches the pull-up circuit to one of ON and OFF. When ON, the pull-up circuit increases a current that is greater than the threshold current flowing in the synchronized signal line. A controller is coupled to the pull-up circuit. The controller generates the control signal to switch the pull-up circuit ON and OFF so that the voltage level of the synchronized signal becomes one of HIGH and LOW without preventing the self-held semiconductor device from transitioning to the OFF state from the ON state.

The invention also provides a method for interfacing with a electronic flash unit. The method includes increasing a current of the synchronized signal line that is greater than the threshold current without preventing the self-held semiconductor device from transitioning to the OFF state from the ON state.

BRIEF DESCRIPTION OF THE DRAWINGS

The invention is described in detail below with reference to the following drawings, wherein.

DETAILED DESCRIPTION OF PREFERRED EMBODIMENTS

Figure 1:
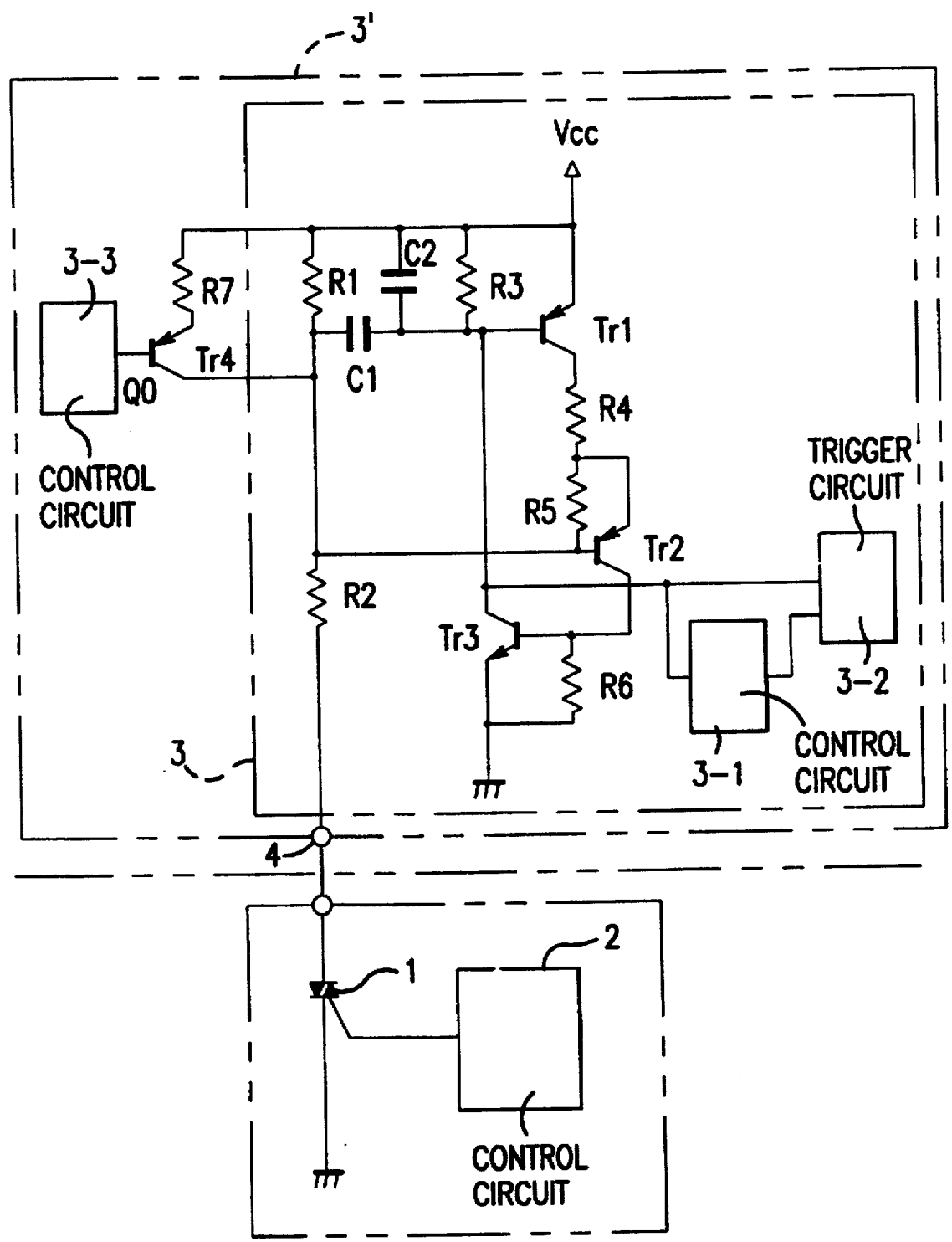
FIG. 1 is a circuit diagram of a preferred embodiment.

FIG. 1 is a circuit diagram of a preferred embodiment. A PNP transistor Tr 4 and a resistor R7 are connected in parallel to a resistor R1 of the interface circuit. The resistor R7 has a lower resistance than the resistor R1. A control circuit 3-3 provides a control output Q0 to the base of the transistor Tr 4. The transistor Tr 4, the resistor R7, and the control circuit 3-3 are added to the interface circuit 3 forming the interface circuit 3'. The resistor R7 and the transistor Tr 4 is a pull-up device which increases the current value of the synchronized signal. The control circuit 3-3 is a control device which drives the pull-up device.

The circuit 3 detects a synchronized signal on the synchronized signal terminal 4 and outputs the detection to flash control circuits 3-1 and 3-2. When the synchronized signal goes to "L", this signal is applied to the base of transistor Tr1 through capacitor C1 and to the base of transistor Tr2 turning both transistors ON. Capacitor C2 and resistor R3 reduce the noise at the base of transistor Tr1.

When transistors Tr1 and Tr2 turn ON, current begins to flow into the base of transistor Tr3 turning it ON. Transistors Tr1 and Tr3 form a latch so that transistors Tr1, Tr2, and Tr3 all remain on until transistor Tr2 is turned off by the synchronized signal of synchronized signal terminal 4 going to "H".

While transistors Tr1, Tr2, and Tr3 are latched to ON, the current flowing to the TRIAC 1 is limited by resistor R1. Further, the current flowing to the TRIAC 1 through the base of transistor Tr2 is limited by the resistor R4. Thus, the current flowing to the TRIAC 1 is maintained to be low so that the TRIAC 1 may turned OFF.

When the TRIAC 1 is turned OFF, the synchronized signal goes to "H" which turns transistor Tr2 OFF. When transistor Tr2 goes OFF, transistor Tr3 is turned OFF which also turns transistor Tr1 OFF. Thus, the synchronized signal from the synchronized signal terminal 4 is transferred to the control circuits 3-1 and 3-2.

Figure 2:
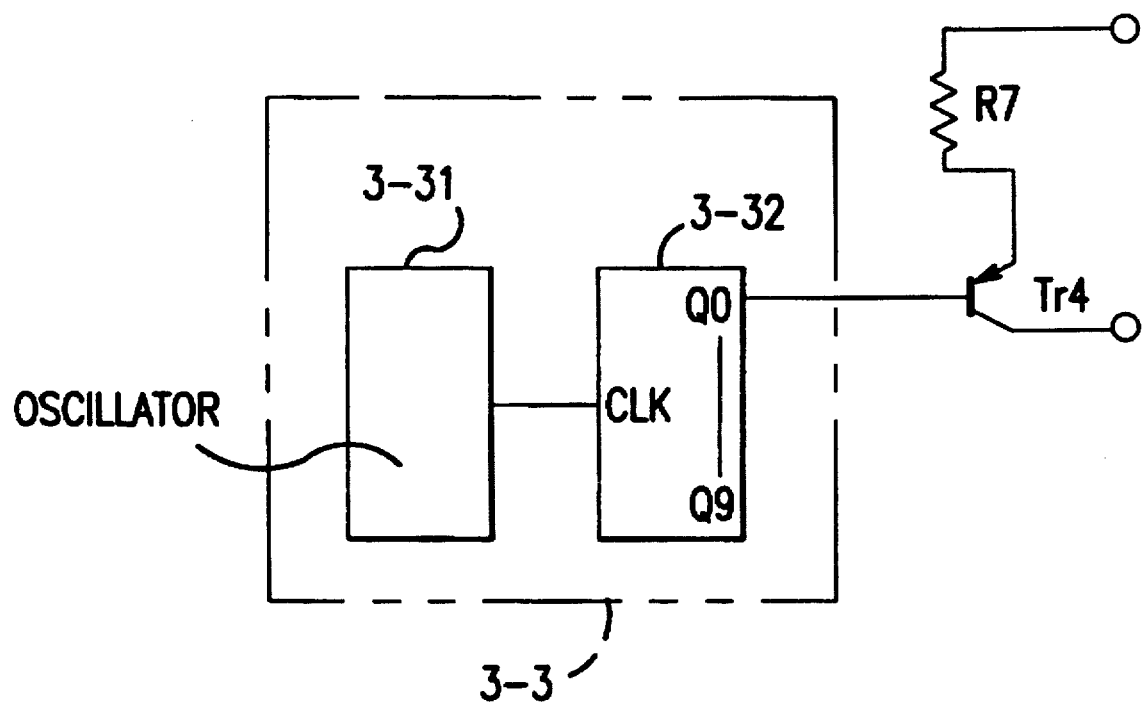
FIG. 2 is a block diagram of the control circuit shown in FIG. 1.

FIG. 2 shows an example of the control circuit 3-3. An oscillator 3-31 outputs a clock signal to a Johnson Counter 3-32. The Johnson Counter 3-32 is a switch-tail ring counter with decoding gates. The Johnson Counter outputs the control circuit output Q0 and Q0 is HIGH for 9 clock signal cycles and LOW for one clock signal cycle. Accordingly, the control output Q0 drives the transistor Tr 4 with a duty cycle of 1/10.

When the control output Q0 is LOW, transistor Tr4 turns ON and connects the resistor R7 in parallel with resistor R1. Because the resistance of the resistor R7 is lower than the resistance of the resistor R1, the current flowing through the resistor R2 into the signal line 5 is increased so that the current flowing through the signal line 5 is greater than the holding current of the Triac 1. The Triac 1 can be switched OFF in spite of the higher current level because the current is increased to be greater than the holding current only for a duty cycle of 1/10. By increasing the current flowing through the signal line 5, the capacitance of the signal line 5 is charged at a much faster rate. Thus, if the Triac 1 is turned OFF, the voltage of the synchronized signal terminal 4 increases more rapidly when the control output Q0 becomes LOW.

Figure 3:
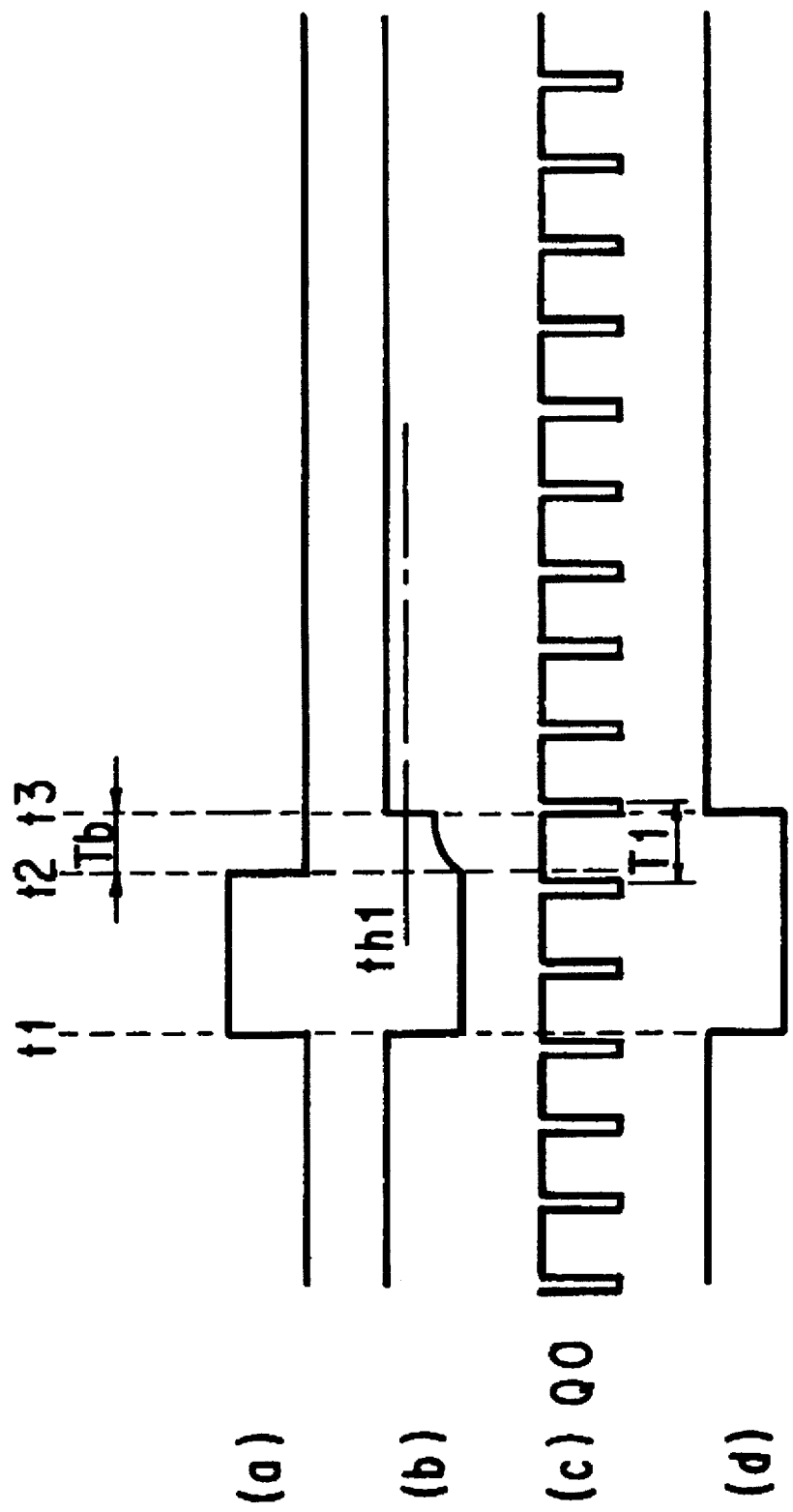
FIG. 3 is a timing diagram for the interface circuit shown in FIG. 1.

FIG. 3 is a timing diagram showing the signals for the interface circuit 3'. When the Triac control signal (a) changes to LOW at t2, the Triac 1 switches OFF immediately. If the transistor Tr 4 switches ON when the control output Q0 becomes LOW at t3, the synchronized signal is pulled up through the resistor R7. Thus, the transistor Tr 4 forces the synchronized signal to HIGH by charging the capacitance of the signal line 5 with the additional current supplied through the resistor R7.

Since the transistor Tr 4 is driven with a duty cycle less than 1, the Triac 1 is switched OFF when the Triac control signal becomes LOW and the transistor Tr 4 is OFF. Additionally, when the Triac 1 is ON and the transistor Tr 4 is ON, the Triac 1 is not affected by the additional current even if the total current through the Triac 1 is greater than the holding current.

However, if the Triac control signal becomes LOW when the transistor Tr 4 is ON, the current flowing through the Triac 1 exceeds the holding current. Thus, if the Triac control signal becomes LOW while the transistor Tr 4 is ON, the Triac 1 continues to conduct current and will not turn OFF until the current flowing through the Triac 1 falls below the holding current. When the transistor Tr 4 turns OFF, the current flowing through the Triac 1 falls below the holding current and the Triac 1 turns OFF. Thus, setting the duty cycle of the transistor Tr 4 to be less than 1 ensures that the Triac 1 will be turned OFF when the Triac control signal becomes LOW within one cycle of the control circuit output Q0.

As shown by waveform (c) in FIG. 3, Q0 has a duty cycle of 1/10 and a cycle time of T1. The Triac 1 turns OFF whenever the Triac control signal (a) becomes LOW and the Q0 signal is HIGH. Even if the Triac control signal becomes LOW at T2 when the signal Q0 is also LOW, the Triac 1 will be turned OFF as soon as the signal Q0 becomes HIGH.

FIG. 3 also shows that the synchronized signal (b) rises slowly after the Triac is turned OFF at T2. However, when the signal Q0 becomes LOW, the synchronized signal quickly rises to above the threshold th1 at time t3. Thus, at time t3, the receiving signal of the strobe (d) changes from LOW to HIGH. Accordingly, the receiving signal of the strobe changes from LOW to HIGH after a delay time of Tb which is the time elapsed between t2 and t3.

In order to achieve the smallest possible delay time Tb from the time the Triac control signal becomes LOW until the receiving signal of the strobe becomes HIGH, the oscillation frequency of the oscillator 3-31 is set to a HIGH value. Thus, it is best for the output period T1 of the Johnson Counter 3-32 to be a small value. The delay time Tb fluctuates according to when the control output Q0 becomes LOW. However, the maximum delay time Tb is equal to T1.

Additionally, the duty cycle of the control output Q0 is considered with respect to connecting multiple strobes to the same Triac 1. If multiple strobes are connected, a small duty cycle is appropriate. For example, if 10 strobes are connected to one Triac 1 and each strobe has the same oscillator frequency, it is possible for each of the respective transistors Tr 4 to be ON successively. Thus, a current greater than the holding current is continuously flowing through the Triac 1. When the Triac control signal becomes LOW, the Triac 1 will not turn OFF because the current through the Triac 1 never falls below the holding current. Thus, the maximum number of strobes that may be connected to one Triac 1 is nine.

If only one strobe is connected, the duty cycle of the control output Q0 must be less than 1, the duty cycle for two strobes must be less than ½. Thus, the duty cycle of the control output Q0 should be selected to match the strobe system.

Figure 4:
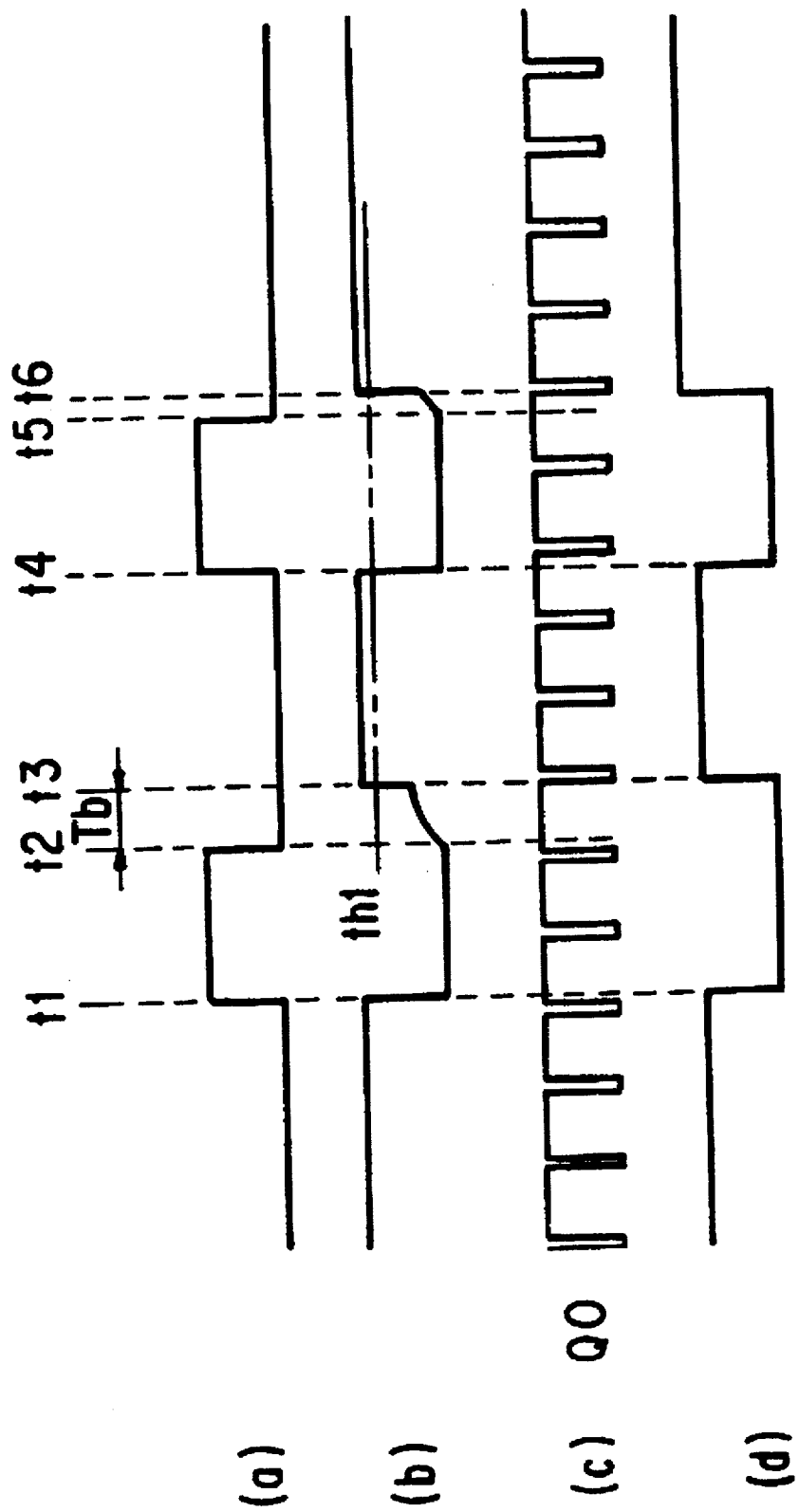
FIG. 4 is a timing diagram of a high speed successive photo shooting for the interface circuit shown in FIG. 1.

With the preferred embodiments, when the camera takes two frames successively at high speeds, the strobe responds by flashing twice. As shown in FIG. 4, the Triac 1 transitions from HIGH to LOW at t2 and then to HIGH at t3. The delay time Tb from the fall of the Triac control signal at t2 until the synchronized signal exceeds the threshold level th1 at t3 is short. The synchronized signal becomes HIGH before the Triac control signal becomes HIGH at t4. Thus, the strobe is able to detect the Triac control signal falling at time t2. Accordingly, the strobe performs synchronized flashes for high speed successive photo shootings.

Figure 5:
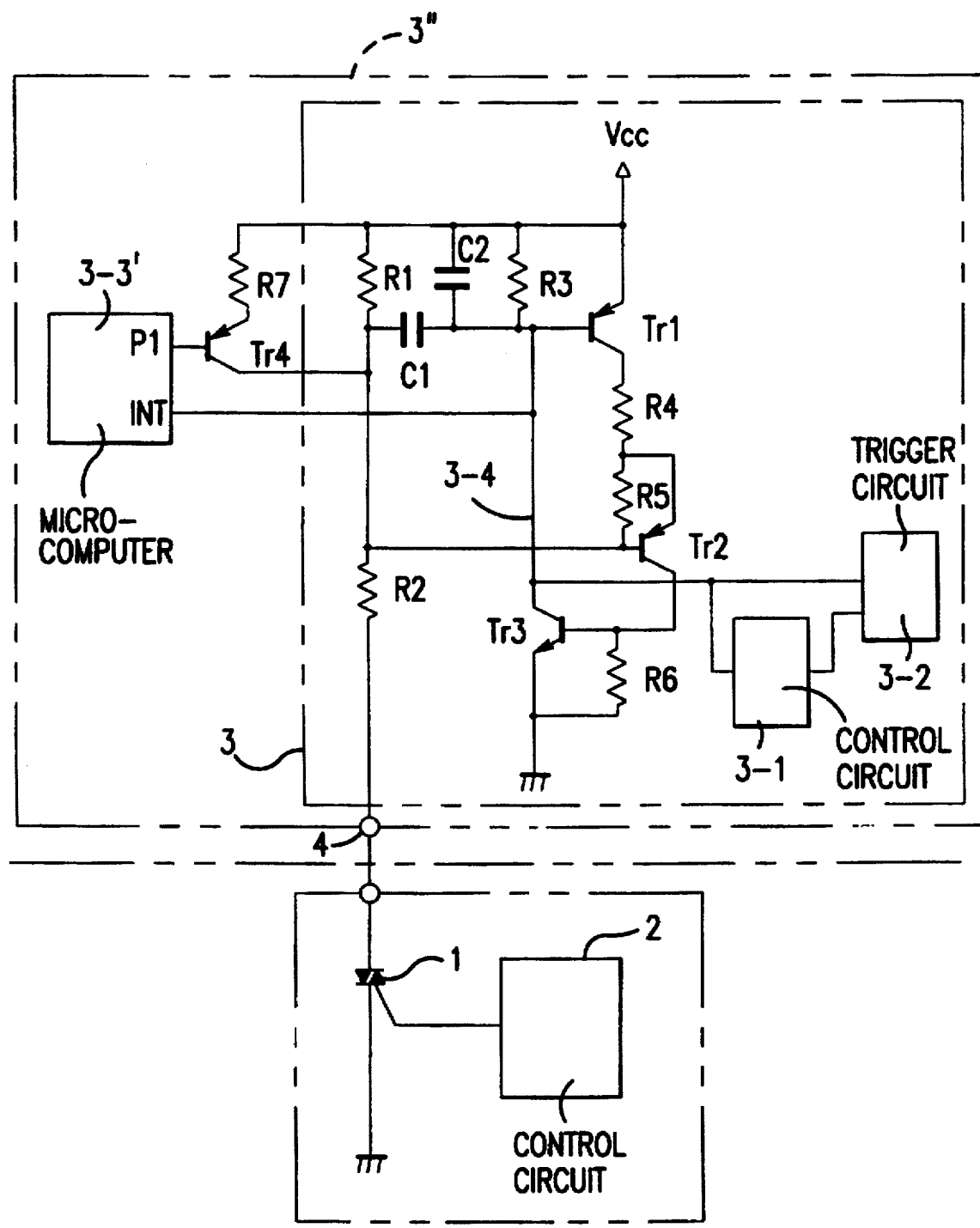
FIG. 5 is a circuit diagram of another embodiment.

FIG. 5 is a circuit diagram of another preferred embodiment. A microcomputer 3-3', which is inside the strobe, controls the transistor T4 4. A port P1 of the microcomputer 3-3' is connected to the base of the transistor Tr 4. The receiving signal line 3-4 of the strobe is connected to the interrupt terminal INT of the microcomputer.

Figure 6A:
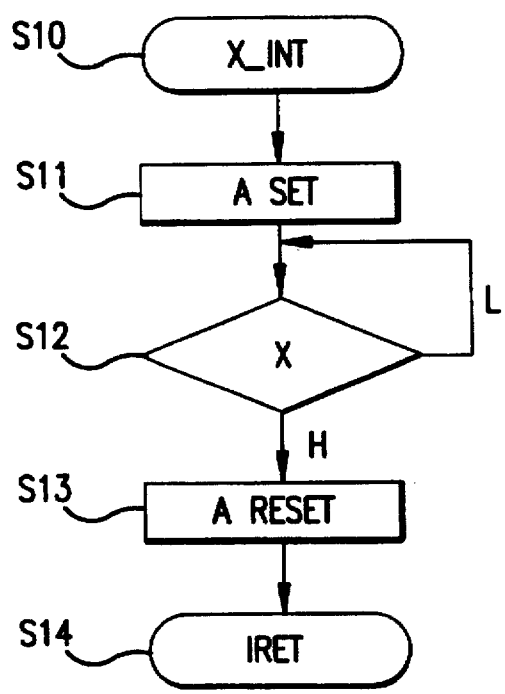
FIG. 6A & B is a flow chart of a process performed by the interface circuit shown in FIG. 5.

When the receiving signal is LOW, the microcomputer 3-3 is interrupted and performs a process shown in FIG. 6a. Based on an interrupt timer, the microcomputer performs a process shown in FIG. 6b. FIGS. 6a and b only show the process related to this embodiment. The microcomputer also perform other processes of the strobe which are not shown.

In FIG. 6a, the microcomputer 3-3' starts at step S10. When the receiving signal becomes LOW, the microcomputer 3-3' goes to step S11. In step S11, a flag A is set. Flag A indicates that the synchronized signal is LOW. Then, the microcomputer 3-3' goes to step S12. In S12, the microcomputer determines whether the receiving signal is HIGH. If the receiving signal is HIGH, the microcomputer goes to step S13. Otherwise, the microcomputer 3-3' remains at step S12. In step S13 the microcomputer 3-3' resets the flag A and then goes to step S14. In step S14 the microcomputer 3-3' returns to other processes of the strobe.

Figure 6B:
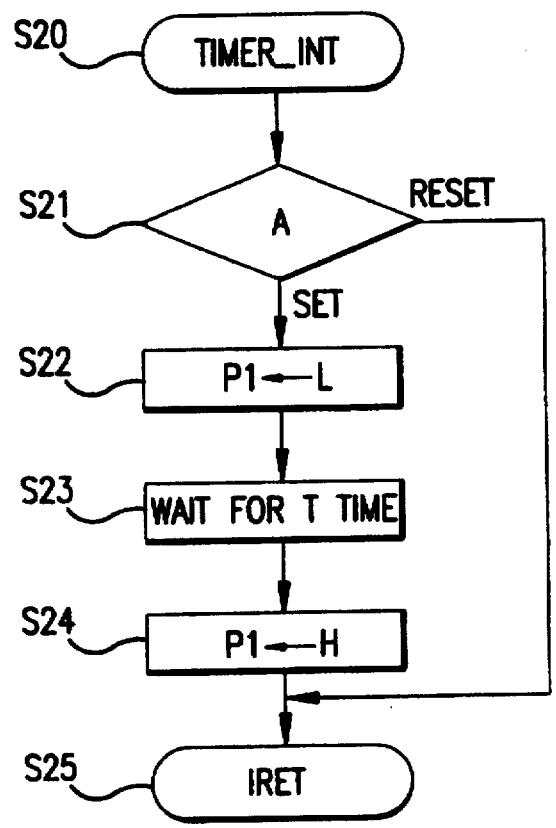

In FIG. 6b, the microcomputer 3-3' starts in step S20. When the interrupt timer expires, the microcomputer 3-3' goes to step S21.

In step S21, the microcomputer 3-3' checks whether the flag A is set. If flag A is not set, the microcomputer 3-3' goes to step S25 and then returns to other strobe processes. If flag A is set, the microcomputer 3-3' goes to step S22. In step S22, the microcomputer 3-3' sets the port P1 to LOW which switches the transistor Tr 4 to ON. Then, the microcomputer 3-3' goes to step S23. In step S23, the microcomputer waits for time T to expire. After time T expires, the microcomputer 3-3' goes to step S24. In step S24, the microcomputer 3-3' sets the port P1 to HIGH which turns transistor Tr 4 to OFF. Then, the microcomputer 3-3' goes to step S25 and returns to other strobe processes.

T is the time in which the current of the synchronized signal is increased. If the resistance of the resistor R7 is a small value, the waiting time T may be zero. However, and there are cases where T is set in the microseconds range.

It is possible to directly sense whether the synchronized signal is HIGH or LOW in step S21. However, doing so may cause steps S22–S24 to be performed during times when the microcomputer 3-3' is busy servicing other interrupt processes. Thus, flag A is set so that steps S22–S24 are not performed during these busy periods. In step S11, A is set after the microcomputer 3-3' completes other time demanding interrupt processes.

Figure 7:
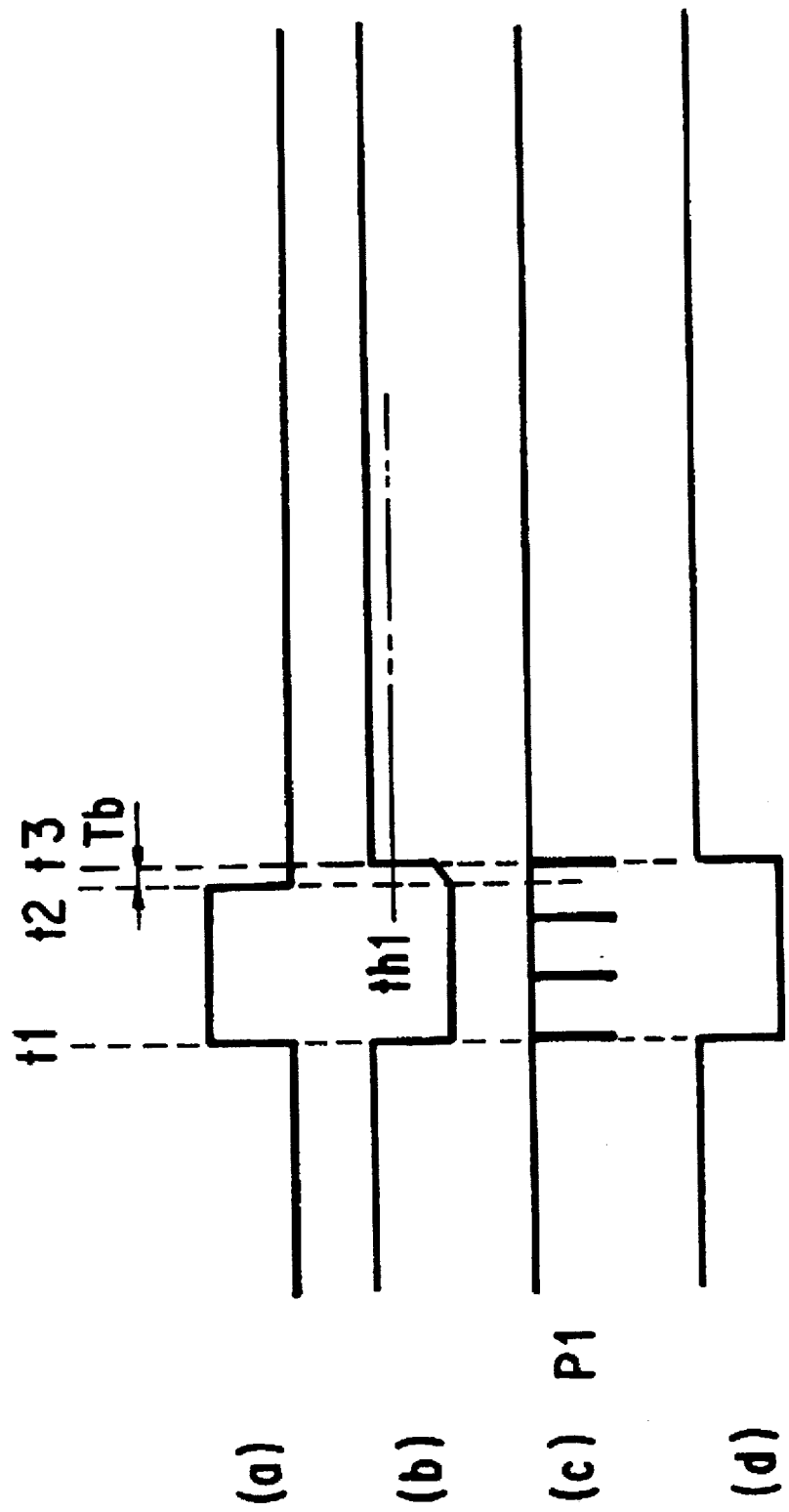
FIG. 7 is a timing diagram for the interface circuit shown in FIG. 5.
Figure 8:
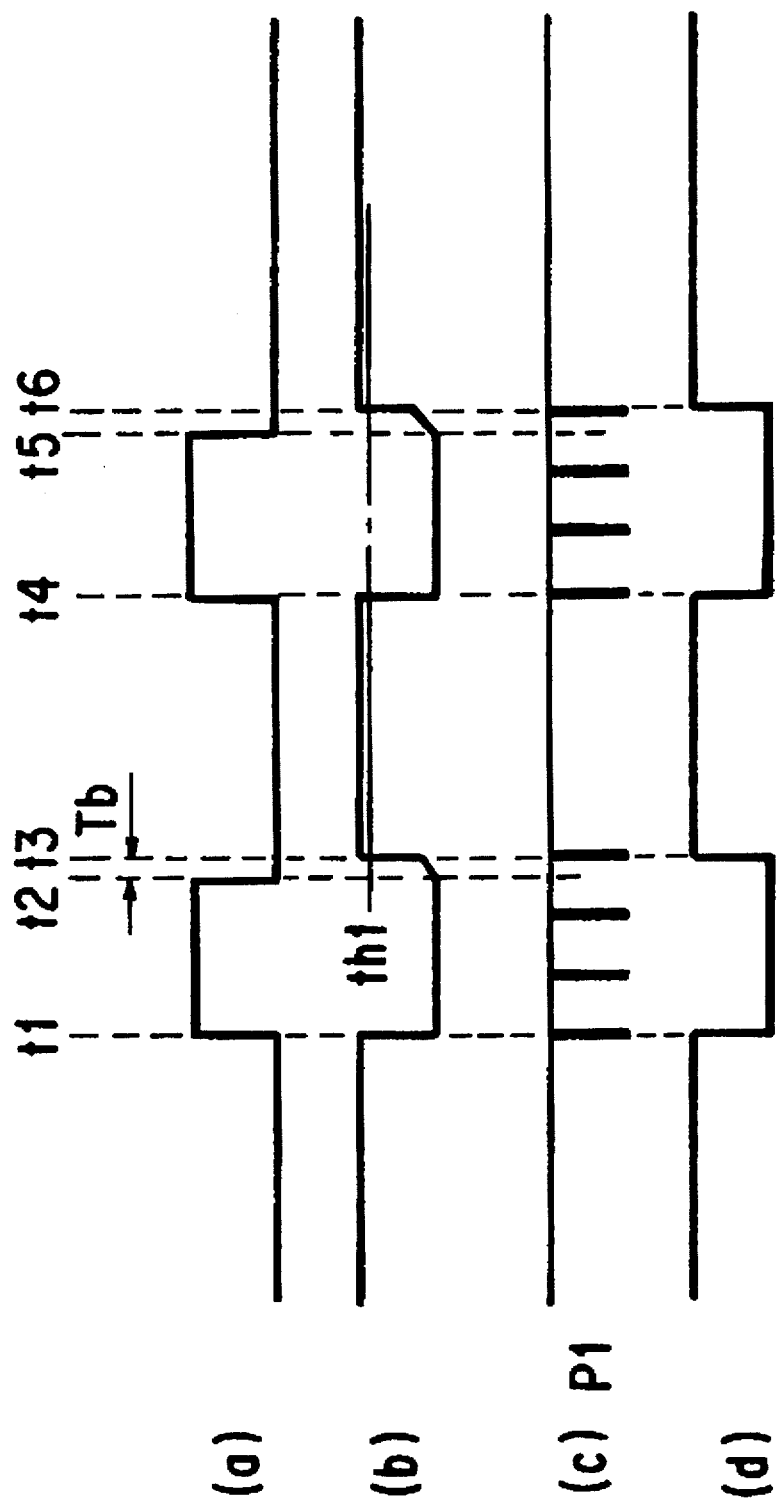
FIG. 8 is a timing diagram of a high speed successive photo shooting for the interface circuit shown in FIG. 5.
Figure 9:
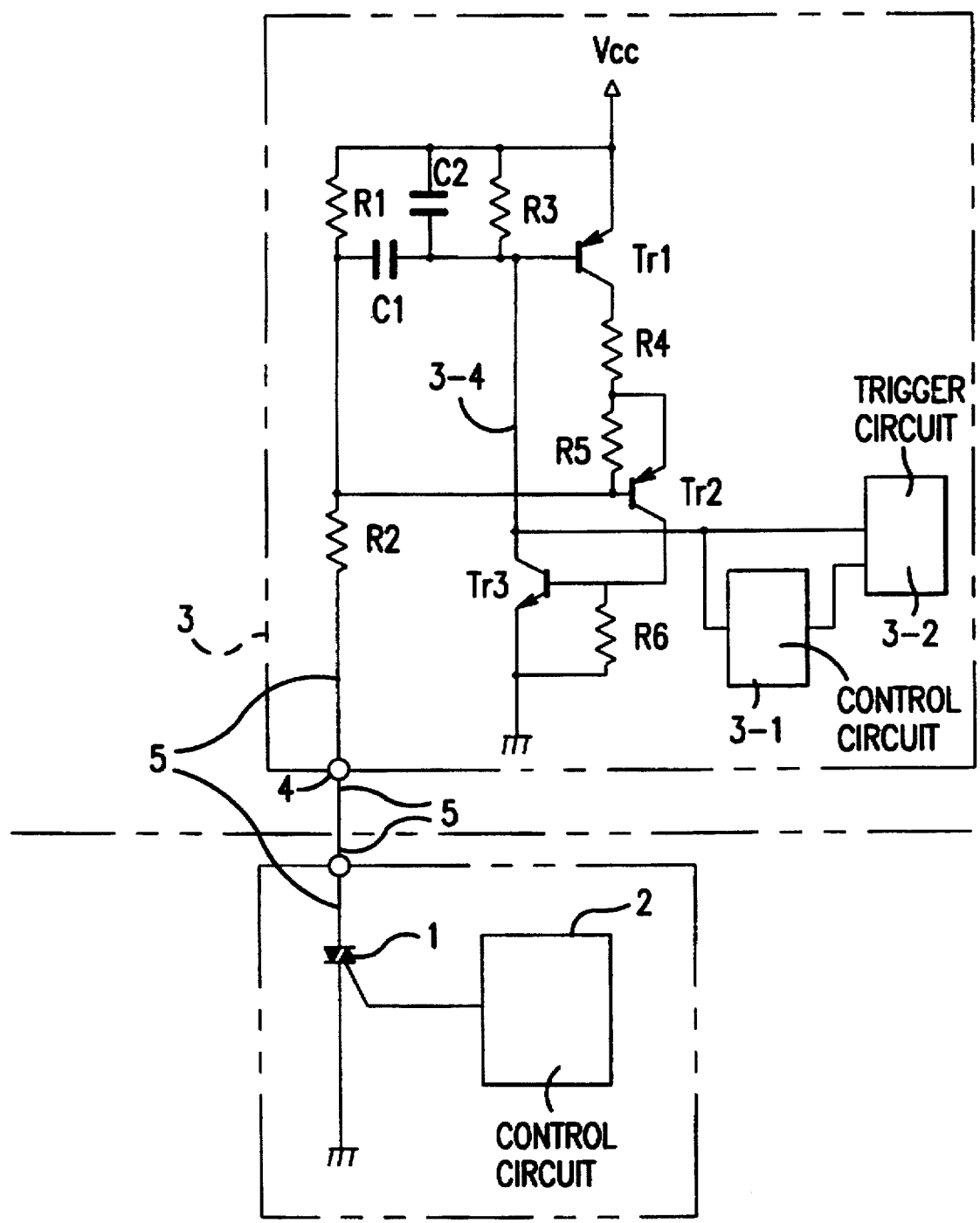
FIG. 9 is a circuit diagram of a prior art example.
Figure 10:
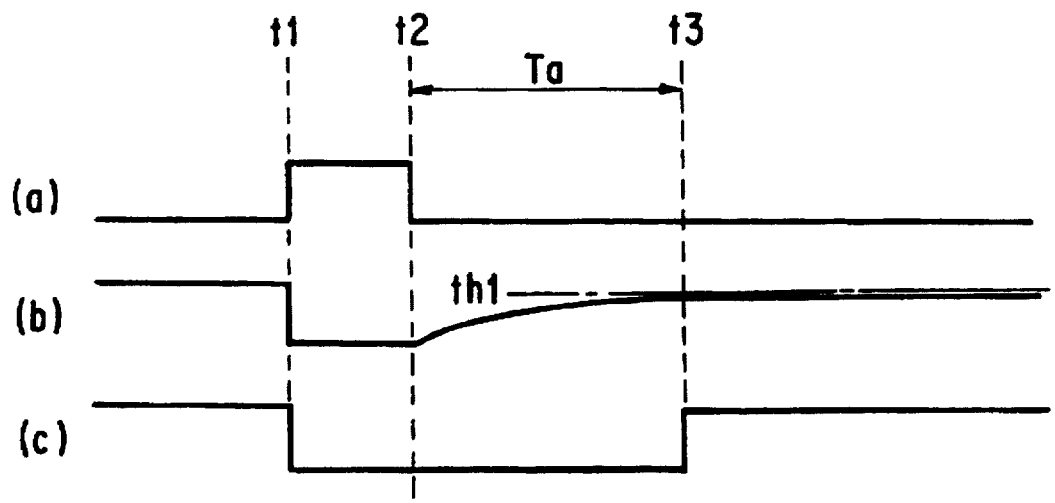
FIG. 10 is a timing diagram of the interface circuit in the prior art.
Figure 11:
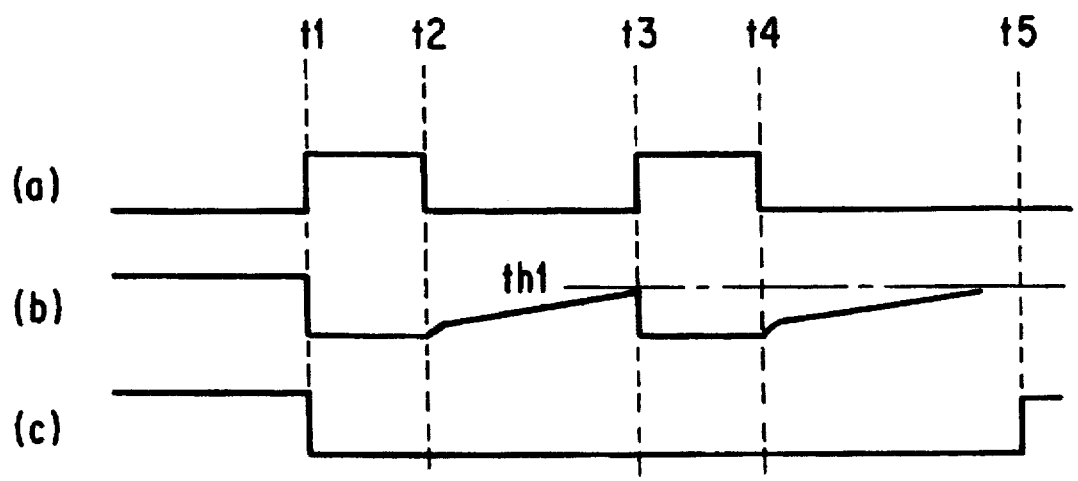
FIG. 11 is a timing diagram of a high speed successive photo shooting for the interface circuit in the prior art.

FIG. 7 is a timing diagram for the interface circuit 3". When the synchronized signal (b) is LOW, the port P1 is set to LOW each time the interrupt timer expires, thus the synchronized signal current is periodically increased. After the Triac control signal (a) falls to LOW, the voltage of the synchronized signal is raised to exceed the threshold th1 by the transistor Tr 4. The transistor Tr 4 is switched ON when the port P1 is set to LOW following expiration of the interrupt timer. Thus, when the camera takes two frames successively at high speeds, the strobe flashes successively synchronized with the high speed successive photo shootings.

Thus, the pull-up device increases the current of the synchronized signal. The control device drives the pull-up device for the time required for the synchronized signal to transition from LOW to HIGH after the Triac 1 is switched OFF. Thus, synchronized strobe flashes responding to high speed photo shootings.

Also by driving the pull-up device by an average duty cycle of less than ½, the current of the synchronized signal is increased periodically. When the Triac 1 is switched OFF, the time required for the synchronized signal to transition from LOW to HIGH is reduced. When the same synchronized signal is used for multiple strobes, the duty cycle can be set to accurately determine the maximum number of strobes that can be connected to the Triac 1. Additionally, the control device which drives the pull-up device can be constructed with an oscillator or a ring counter and so forth. Thus, a relatively inexpensive electronic flash unit is possible without using a microcomputer.

By driving the pull-up device with the average duty cycle of less than ½ only when the synchronized signal is LOW, the amount of current of required by the control circuit is minimized. When the control device is a portion of the microcomputer 3-3', a highly functional electronic flash unit is provided with only the addition of a small amount of hardware and software added to the microcomputer 3-3'.

While this invention has been described in conjunction with specific embodiments thereof, it is evident that many alternatives, modifications and variations will be apparent to those skilled in the art.

For example, a voltage level being HIGH may be either a high voltage potential or low voltage potential. While the interface circuit discussed above assume that HIGH correspond to the high voltage potential, an interface circuit can be implemented if HIGH corresponds to a low voltage potential. This can be done by exchanging PNP and NPN transistors and Vcc and ground terminals.

Accordingly, the preferred embodiments of the invention as set forth herein are intended to be illustrative, not limiting. Various changes may be made without departing from the spirit and scope of the invention as defined in the following claims.

What is claimed is:

1. An interface circuit that interfaces an electronic flash unit with a self-held semiconductor device, the interface circuit comprising:

a pull-up circuit coupled to a synchronized signal line, supplying current to the synchronized signal line greater than a holding current of the self-held semiconductor device when the pull-up circuit is on the synchronized signal line connecting the electronic flash unit with the self-held semiconductor device; and a controller coupled to the pull-up circuit, the controller generating a control signal to cycle the pull-up circuit ON and OFF, a voltage level of the synchronized signal line becoming HIGH when the pull-up circuit is ON and the self-held semiconductor device is OFF, the controller allowing the self-held semiconductor device to transition from an ON state to an OFF state when the pull-up circuit is OFF.

2. The interface circuit of claim 1, wherein the pull-up circuit raises the voltage level of the synchronized signal line to HIGH by increasing a current flowing in the synchronized signal line.

3. The interface circuit of claim 1, wherein the pull-up circuit comprises:

a resistor; and a transistor connected to the resistor, a control terminal of the transistor receiving the control signal.

4. The interface circuit of claim 1, wherein the controller comprises:

an oscillator generating a clock signal;

a counter device coupled to the oscillator, the counter device receiving the clock signal and outputting the control signal, the control signal having a duty cycle that is a fraction of a period of the clock signal.

5. The interface circuit of claim 4, wherein the control signal has an average duty cycle of less than ½.

6. The interface circuit of claim 4, wherein the counter device is one of a Johnson counter and a ring counter.

7. The interface circuit of claim 1, wherein the controller comprises a microcomputer, the microcomputer being coupled to the synchronized signal line through an input port and outputting the control signal through an output port.

8. The interface circuit of claim 7, wherein the microcomputer includes a timer, the timer determining a duty cycle of the control signal.

9. The interface circuit of claim 8, wherein the an average duty cycle of the control signal is less than ½.

10. The interface circuit of claim 8, wherein the control signal switches the pull-up circuit ON only when the voltage level of the synchronized signal line is LOW.

11. The interface circuit of claim 10, wherein an average duty cycle of the control signal is less than ½.

12. A method for interfacing an electronic flash unit with a self-held semiconductor device, a synchronized signal line connecting the electronic flash unit to the self-held semiconductor device, the method comprising:

cycling a pull-up circuit ON and OFF, the pull-up circuit supplying current to the synchronized signal line greater than a holding current of the self-held semiconductor device when the pull-up circuit is ON a voltage level of the synchronized signal line becoming HIGH when the pull-up circuit is ON and the self-held semiconductor device is OFF; and allowing the self-held semiconductor device to transition from an ON state to an OFF state when the pull-up circuit is OFF.

13. The method of claim 12, wherein the pull-up circuit raises the voltage level of the synchronized signal line to HIGH by increasing a current flowing in the synchronized signal line.

14. The method of claim 12, wherein the pull-up circuit inputs a control signal, a controller generating the control signal with a duty cycle.

15. The method of claim 14, wherein an average duty cycle of the control signal is less than ½.

16. A device that interfaces an electronic flash unit with a self-held semiconductor device, a synchronized signal line connecting the electronic flash unit to the self-held semiconductor device, the device comprising:

pull-up circuit means coupled to the synchronized signal line for raising a voltage level of the synchronized signal line supplying current to the synchronized signal line greater than a holding current of the self-held semiconductor device when the pull-up circuit is on; and cycling means coupled to the pull-up means for cycling the pull-up circuit means ON and OFF, the voltage level of the synchronized signal line becomes HIGH when the pull-up circuit means is ON and the self-held semiconductor device is OFF; the cycling means allowing the self-held semiconductor device to transition from an ON state to an OFF state when the pull-up circuit is OFF.

17. The device of claim 16, wherein the pull-up circuit means raises the voltage level of the synchronized signal line by increasing a current flowing in the synchronized signal line.

18. The device of claim 16, wherein the cycling means controls the pull-up circuit means through a control signal, the control means generating the control signal with a duty cycle.

19. The device of claim 18, wherein an average duty cycle of the control signal is less than ½.

* * * * *